United States Patent
Hoge

(10) Patent No.: US 7,235,790 B2
(45) Date of Patent: Jun. 26, 2007

(54) METHODS AND APPARATUS FOR RADIATION DETECTION

(75) Inventor: Michael Fred Hoge, Waukesha, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 195 days.

(21) Appl. No.: 10/780,012

(22) Filed: Feb. 17, 2004

(65) Prior Publication Data

US 2005/0178971 A1    Aug. 18, 2005

(51) Int. Cl.
*G01T 1/24* (2006.01)
(52) U.S. Cl. .............................. 250/370.11; 250/370.09
(58) Field of Classification Search ........... 250/370.11, 250/370.09, 363.01, 363.02
See application file for complete search history.

(56) References Cited

U.S. PATENT DOCUMENTS

| | | | |
|---|---|---|---|
| 4,789,930 A | 12/1988 | Sones et al. | |
| 4,963,746 A | 10/1990 | Morgan et al. | |
| 4,980,904 A | 12/1990 | Sones et al. | |
| 5,241,576 A | 8/1993 | Lonn | |
| 5,467,377 A | 11/1995 | Dawson | |
| 5,487,098 A * | 1/1996 | Dobbs et al. | 378/19 |
| 5,583,343 A * | 12/1996 | Dilmanian et al. | 250/475.2 |
| 5,668,851 A * | 9/1997 | Dobbs | 378/19 |
| 5,708,691 A | 1/1998 | Zmora | |
| 6,163,028 A * | 12/2000 | Orava et al. | 250/370.08 |
| 6,173,029 B1 | 1/2001 | Xie et al. | |
| RE37,536 E | 2/2002 | Barnes | |
| 6,359,279 B1 | 3/2002 | Gagnon et al. | |
| 6,426,992 B1 | 7/2002 | Köhler et al. | |
| 6,552,349 B2 | 4/2003 | Gagnon et al. | |
| 6,624,900 B1 * | 9/2003 | Eisenhauer et al. | 356/614 |
| 6,661,866 B1 | 12/2003 | Limkeman et al. | |
| 6,717,152 B2 * | 4/2004 | Izumi | 250/370.12 |
| 6,823,039 B2 * | 11/2004 | Hoheisel et al. | 378/19 |
| 7,078,702 B2 * | 7/2006 | Ringermacher et al. | 250/370.11 |

OTHER PUBLICATIONS

US 6,055,290, 04/2000, Xie et al. (withdrawn)

* cited by examiner

*Primary Examiner*—Constantine Hannaher
(74) *Attorney, Agent, or Firm*—Armstrong Teasdale LLP

(57) ABSTRACT

A method for fabricating a detector assembly includes positioning a first scintillator array on a first side of a flexible member, and positioning a first collimator array on a second side of the flexible member.

25 Claims, 5 Drawing Sheets

METHODS AND APPARATUS FOR RADIATION DETECTION

BACKGROUND OF THE INVENTION

This invention relates generally to methods and apparatus for computed tomography (CT), and more particularly to methods and apparatus that provide for radiation detection.

Modular radiation detector arrays typically include a collimator, a scintillator array or package, and a photo diode assembly. The collimator, scintillator package, and diode assembly are precision aligned and attached together to form a detector module. A number of modules are mounted on rails to form the detector array.

The accurate positioning of the collimator, scintillator package, and diode assembly to attach and optically couple them together can be problematic. Additionally, the accurate positioning of the modules relative to one another to form the detector array can be problematic.

BRIEF DESCRIPTION OF THE INVENTION

In one aspect, a method for fabricating a detector assembly is provided. The method includes positioning a first scintillator array on a first side of a flexible member, and positioning a first collimator array on a second side of the flexible member.

In another aspect, a method for fabricating a detector array is provided. The method includes providing a plurality of diode assemblies each including at least one alignment datum, providing a plurality of scintillator packages each including at least one alignment datum, providing a plurality of collimator arrays each including at least one alignment datum, and optically coupling each diode assembly with one respective scintillator package and one respective collimator array by aligning the alignment datums of the respective diode assembly, scintillator package, and collimator array.

In yet another aspect, a method of replacing a detector module in a modular detector including at least one existing module including an alignment datum is provided. The method includes removing a module to be replaced from the assembly, providing a replacement module including at least one alignment datum, and using an alignment tool comprising a body with at least two alignment datums extending therefrom to position the replacement module in the assembly with respect to the existing module.

In one aspect, a method for fabricating a plurality of detector assemblies is provided. The method includes providing a plurality of diode assemblies each including at least one alignment datum, providing a plurality of scintillator packages each including at least one alignment datum, providing a plurality of collimator arrays each including at least one alignment datum, optically coupling each diode assembly with one respective scintillator package and one respective collimator array by aligning the alignment datums of the respective diode assembly, scintillator package, and collimator array to form a plurality of detector modules, positioning N detector modules on a first member to form a first detector assembly, and positioning M detector modules on a second member to form a second detector assembly, wherein M is not equal to N and the first and second detector assemblies are different sized.

In still another aspect, a detector assembly is provided. The detector assembly includes a flexible member including a first side and a second side, a first scintillator array positioned on the first side of the flexible member, and a first collimator array positioned on the second side of the flexible member, the collimator optically coupled to the scintillator array.

In another aspect, a detector assembly is provided. The detector assembly includes a diode assembly including at least one alignment datum, a scintillator package including at least one alignment datum, and a collimator array including at least one alignment datum aligned with said diode assembly alignment datum and said diode assembly alignment datum, wherein said diode assembly, said scintillator package, and said collimator are optically coupled.

In one aspect, an imaging system is provided. The imaging system includes a radiation source, a computer operationally coupled to the radiation source, and a radiation detector assembly operationally coupled to the computer, the detector assembly includes a diode assembly including at least one alignment datum, a scintillator package including at least one alignment datum, and a collimator array including at least one alignment datum aligned with the diode assembly alignment datum and the diode assembly alignment datum, wherein the diode assembly, the scintillator package, and the collimator are optically coupled.

DETAILED DESCRIPTION OF THE INVENTION

Figure 1:
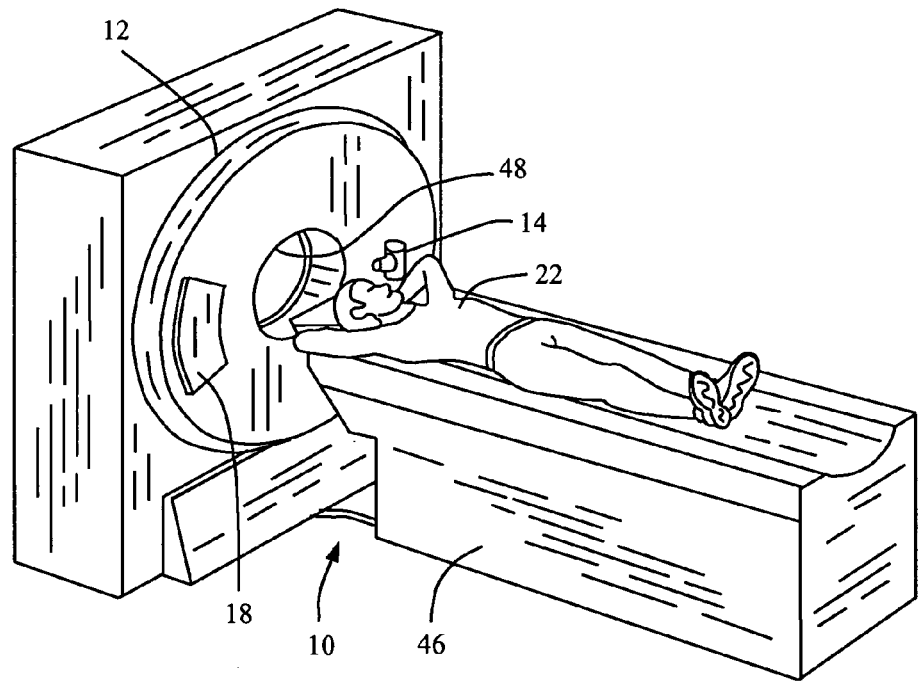
FIG. 1 is a pictorial view of a CT imaging system embodiment.

There are herein provided radiation detection methods and apparatus useful for imaging systems such as, for example, but not limited to a Computed Tomography (CT) System. The apparatus and methods are illustrated with reference to the figures wherein similar numbers indicate the same elements in all figures. Such figures are intended to be illustrative rather than limiting and are included herewith to facilitate explanation of an exemplary embodiment of the apparatus and methods of the invention.

In some known CT imaging system configurations, a radiation source projects a fan-shaped beam which is collimated to lie within an X-Y plane of a Cartesian coordinate system and generally referred to as an "imaging plane". The radiation beam passes through an object being imaged, such as a patient. The beam, after being attenuated by the object, impinges upon an array of radiation detectors. The intensity of the attenuated radiation beam received at the detector array is dependent upon the attenuation of a radiation beam by the object. Each detector element of the array produces a separate electrical signal that is a measurement of the beam attenuation at the detector location. The attenuation measurements from all the detectors are acquired separately to produce a transmission profile.

In third generation CT systems, the radiation source and the detector array are rotated with a gantry within the imaging plane and around the object to be imaged such that an angle at which the radiation beam intersects the object constantly changes. A group of radiation attenuation measurements, i.e., projection data, from the detector array at one gantry angle is referred to as a "view". A "scan" of the object includes a set of views made at different gantry angles, or view angles, during one revolution of the radiation source and detector.

In an axial scan, the projection data is processed to reconstruct an image that corresponds to a two dimensional slice taken through the object. One method for reconstructing an image from a set of projection data is referred to in the art as the filtered back projection technique. This process converts the attenuation measurements from a scan into integers called "CT numbers" or "Hounsfield units", which are used to control the brightness of a corresponding pixel on a display device.

To reduce the total scan time, a "helical" scan may be performed. To perform a "helical" scan, the patient is moved while the data for the prescribed number of slices is acquired. Such a system generates a single helix from a fan beam helical scan. The helix mapped out by the fan beam yields projection data from which images in each prescribed slice may be reconstructed.

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features.

Also as used herein, the phrase "reconstructing an image" is not intended to exclude embodiments of the present invention in which data representing an image is generated but a viewable image is not. Therefore, as used herein the term, "image," broadly refers to both viewable images and data representing a viewable image. However, many embodiments generate (or are configured to generate) at least one viewable image.

Figure 2:
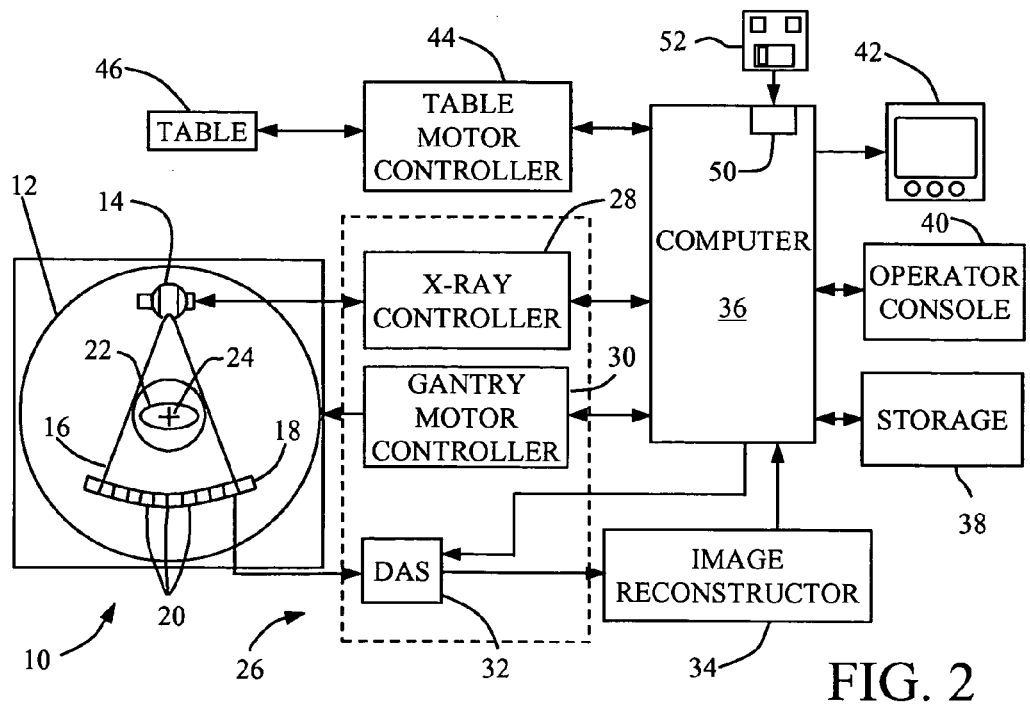
FIG. 2 is a block schematic diagram of the system illustrated in FIG. 1.

FIG. 1 is a pictorial view of a CT imaging system 10. FIG. 2 is a block schematic diagram of system 10 illustrated in FIG. 1. In the exemplary embodiment, a computed tomography (CT) imaging system 10, is shown as including a gantry 12 representative of a "third generation" CT imaging system. Gantry 12 has a radiation source 14 that projects a cone beam 16 of X-rays toward a detector array 18 on the opposite side of gantry 12.

Detector array 18 is formed by a plurality of detector rows (not shown in FIGS. 1 and 2) including a plurality of detector elements 20 which together sense the projected X-ray beams that pass through an object, such as a medical patient 22. Each detector element 20 produces an electrical signal that represents the intensity of an impinging radiation beam and hence the attenuation of the beam as it passes through object or patient 22. An imaging system 10 having a multislice detector 18 is capable of providing a plurality of images representative of a volume of object 22. Each image of the plurality of images corresponds to a separate "slice" of the volume. The "thickness" or aperture of the slice is dependent upon the thickness of the detector rows.

During a scan to acquire radiation projection data, gantry 12 and the components mounted thereon rotate about a center of rotation 24. FIG. 2 shows only a single row of detector elements 20 (i.e., a detector row). However, multislice detector array 18 includes a plurality of parallel detector rows of detector elements 20 such that projection data corresponding to a plurality of quasi-parallel or parallel slices can be acquired simultaneously during a scan.

Rotation of gantry 12 and the operation of radiation source 14 are governed by a control mechanism 26 of CT system 10. Control mechanism 26 includes a radiation controller 28 that provides power and timing signals to radiation source 14 and a gantry motor controller 30 that controls the rotational speed and position of gantry 12. A data acquisition system (DAS) 32 in control mechanism 26 samples analog data from detector elements 20 and converts the data to digital signals for subsequent processing. An image reconstructor 34 receives sampled and digitized radiation data from DAS 32 and performs high-speed image reconstruction. The reconstructed image is applied as an input to a computer 36 which stores the image in a mass storage device 38.

Computer 36 also receives commands and scanning parameters from an operator via a console 40 that has a keyboard. An associated cathode ray tube display 42 allows the operator to observe the reconstructed image and other data from computer 36. The operator supplied commands and parameters are used by computer 36 to provide control signals and information to DAS 32, radiation controller 28, and gantry motor controller 30. In addition, computer 36 operates a table motor controller 44 which controls a motorized table 46 to position patient 22 in gantry 12. Particularly, table 46 moves portions of patient 22 through gantry opening 48.

In one embodiment, computer 36 includes a device 50, for example, a floppy disk drive, CD-ROM drive, DVD drive, magnetic optical disk (MOD) device, or any other digital device including a network connecting device such as an Ethernet device for reading instructions and/or data from a computer-readable medium 52, such as a floppy disk, a CD-ROM, a DVD or an other digital source such as a network or the Internet, as well as yet to be developed digital means. In another embodiment, computer 36 executes instructions stored in firmware (not shown). Generally, a processor in at least one of DAS 32, reconstructor 34, and computer 36 shown in FIG. 2 is programmed to execute the processes described below. Of course, the method is not limited to practice in CT system 10 and can be utilized in connection with many other types and variations of imaging systems. In one embodiment, Computer 36 is programmed to perform functions described herein, accordingly, as used herein, the term computer is not limited to just those integrated circuits referred to in the art as computers, but broadly refers to computers, processors, microcontrollers, microcomputers, programmable logic controllers, application specific integrated circuits, and other programmable circuits. Although the herein described methods are described in a medical setting, it is contemplated that the benefits of the invention accrue to non-medical imaging systems such as those systems typically employed in an industrial setting or a transportation setting, such as, for example, but not limited to, a baggage scanning CT system for an airport or other transportation center.

Figure 3:
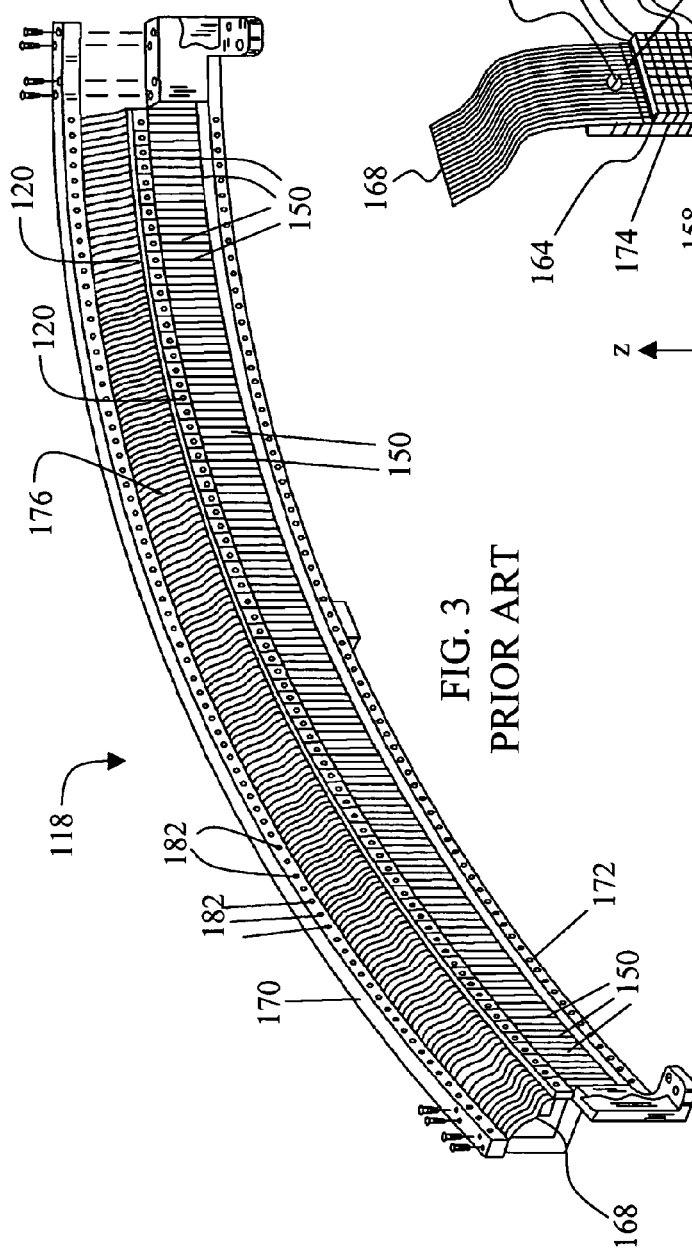
FIG. 3 illustrates a known detector array.
Figure 4:
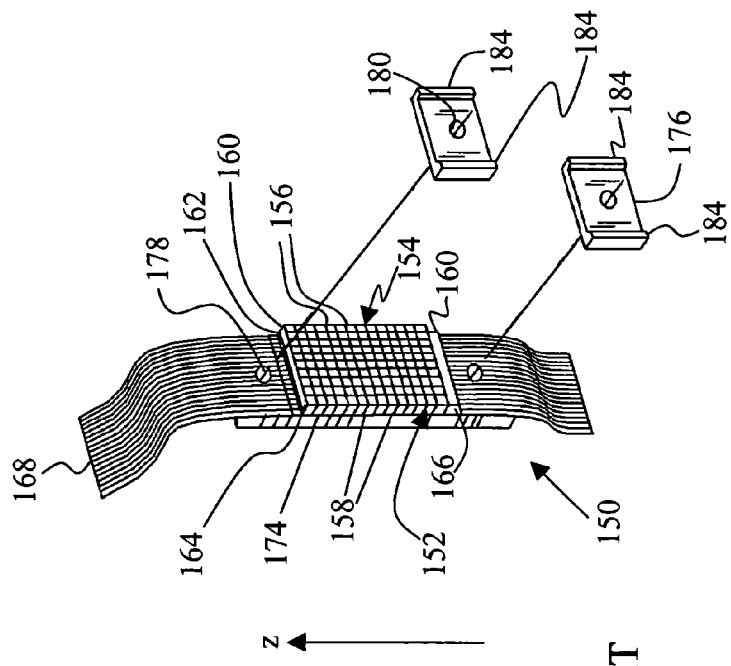
FIG. 4 illustrates the known detector array shown in FIG. 3.

As shown in FIGS. 3 and 4, a known detector array 118 includes a plurality of detector modules 150, each module comprising an array of detector elements 120. Each detector module 150 includes a high-density photosensor array 152 and a multidimensional scintillator array 154 positioned above and adjacent to photosensor array 152. Particularly, scintillator array 154 includes a plurality of scintillators 156, while photosensor array 152 includes photodiodes 158, a switch apparatus 160, and a decoder 162. A material such as a titanium dioxide-filled epoxy fills the small spaces in front of and between scintillator elements. In one embodiment, photodiodes 158 are individual photodiodes. In another embodiment, photodiodes 158 are a multidimensional diode array. In either embodiment, photodiodes 158 are deposited or formed on a substrate. Scintillator array 154, as known in the art, is positioned over or adjacent photodiodes 58. Photodiodes 158 are optically coupled to scintillator array 154 and have electrical output lines for transmitting signals representative of the light output by scintillator array 154. Each photodiode 158 produces a separate low level analog output signal that is a measurement of beam attenuation for a specific scintillator of scintillator array 154. Photodiode output lines (not shown) may, for example, be physically located on one side of module 120 or on a plurality of sides of module 120. As illustrated in FIG. 4, photodiode outputs are located at opposing sides of the photodiode array.

As shown in FIG. 3, detector array 118 includes fifty-seven detector modules 150. Each detector module 150 includes a photosensor array 152 and scintillator array 154, each having a detector element 120 array size of 16×16. As a result, array 118 is segmented into 16 rows and 912 columns (16×57 modules) allowing up to N=16 simultaneous slices of data to be collected along a z-axis with each rotation of a gantry, where the z-axis is an axis of rotation of the gantry. In other embodiments, detector element 120 array size is different than 16×16, and/or detector array 118 includes less than or more than fifty-seven detector modules 150.

Switch apparatus 160 is a multidimensional semiconductor switch array. Switch apparatus 160 is coupled between photosensor array 152 and a DAS. Switch apparatus 160, in one embodiment, includes two semiconductor switch arrays 164 and 166. Switch arrays 164 and 166 each includes a plurality of field effect transistors (FETS) (not shown) arranged as a multidimensional array. Each FET includes an input electrically connected to one of the respective photodiode output lines, an output, and a control (not shown) arranged as a multidimensional array.

Each FET includes an input electrically connected to one of the respective photodiode output lines, an output, and a control (not shown). FET outputs and controls are connected to lines that are electrically connected to a DAS via a flexible electrical cable 168.

Decoder 162 controls the operation of switch apparatus 160 to enable, disable, or combine photodiode 158 outputs depending upon a desired number of slices and slice resolution for each slide. Decoder 162 in one embodiment, is a FET controller as known in the art. Decoder 162 includes a plurality of output and control lines coupled to switch apparatus 160 and a DAS. Particularly, the decoder outputs are electrically coupled to the switch apparatus control lines to enable switch apparatus 160 to transmit the proper data from the switch apparatus inputs to the switch apparatus outputs.

As shown in FIG. 3, detector modules 150 are filled in a detector array 118 and secured in place by rails 170 and 172. FIG. 3 shows rail 172 secured in place, while rail 170 is positioned to be secured over electrical cable 168, over module substrate 174, flexible cable 168, and mounting bracket 176. Screws (not shown) are then threaded through holes 178 and 180 and into threaded holes 182 of rail 170 to secure modules 150 in place. Flanges 184 of mounting brackets 176 are held in place by compression against rails 170 and 172 and prevent detector modules 150 from "rocking". Mounting brackets 176 also clamp flexible cable 168 against substrate 174. Alignment of components of detector 118 may be difficult sometimes.

Figure 5:
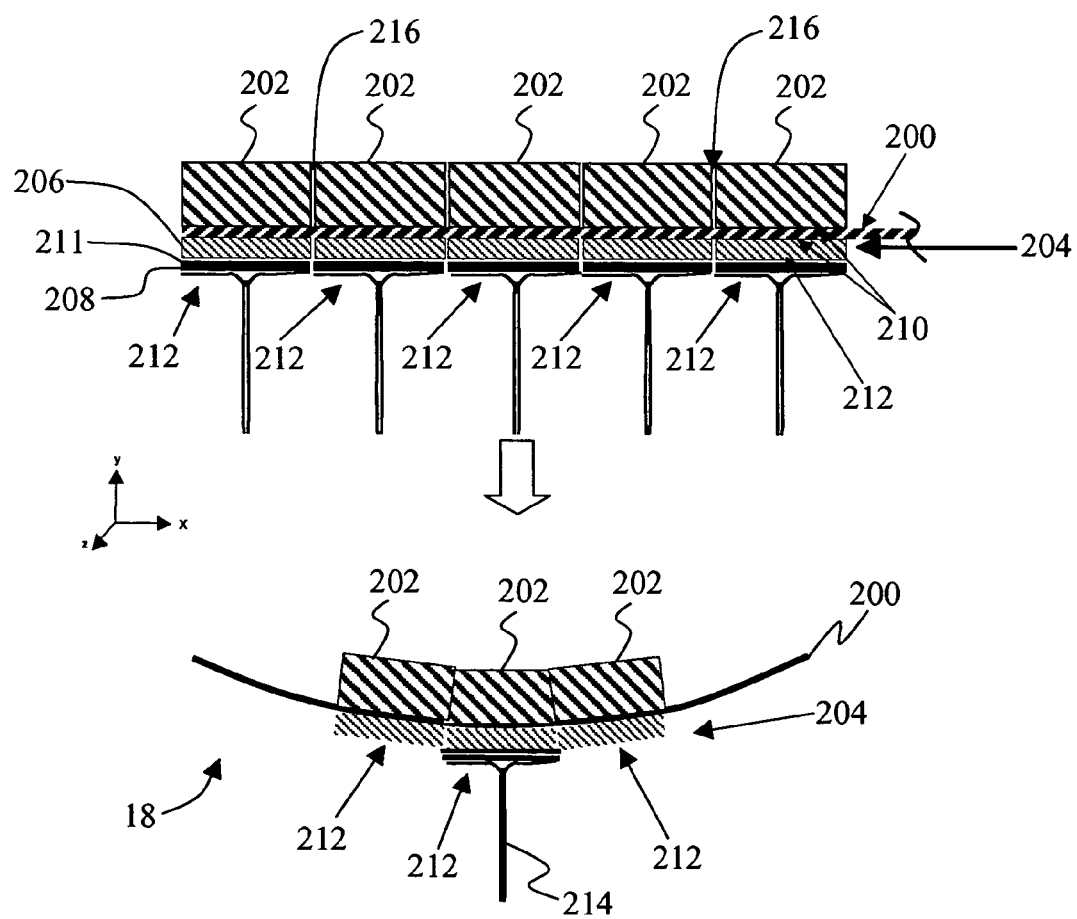
FIG. 5 illustrates the detector array shown in FIG. 1.

FIG. 5 illustrates detector array 18 including a flexible member 200. A plurality of collimator arrays 202 are positioned on one side of flexible member 200. A plurality of scintillator arrays 204 are positioned on another side of flexible member 200. Each scintillator array 204 includes a scintillator package 206 optically coupled to a diode assembly 208. In one embodiment, an adhesive 210 is used to attach collimator arrays 202 and scintillator arrays 204 to flexible member 200. A coupler 211 couples scintillator packages 206 to diode assemblies 208. Each system of a single collimator array 202 and a single scintillator array forms a detector module 212. An output line 214 is coupled to each module 212. Typically, as explained in greater detail below, each module 212 is mounted to flexible member 200 while flexible member 200 is unflexed (i.e., substantially linear, e.g., top view in FIG. 5), and mounted to rails similar to or identical to rails 170 and 172 (shown in FIG. 3) in which flexible member 200 is bent in an arc (shown in bottom view in FIG. 5). Flexible member 200 is formed of any flexible material substantially translucent to x-rays, and, in one embodiment, is fabricated from graphite. Each module 212 is mounted on flexible member 200 and separated from each other by a space 216 selectable in size dependent upon a desired radius of curvature. For example, in one embodiment, space 216 is selected such that a 950 mm radius arc is obtainable when flexible member 200 is bent accordingly.

Figure 6:
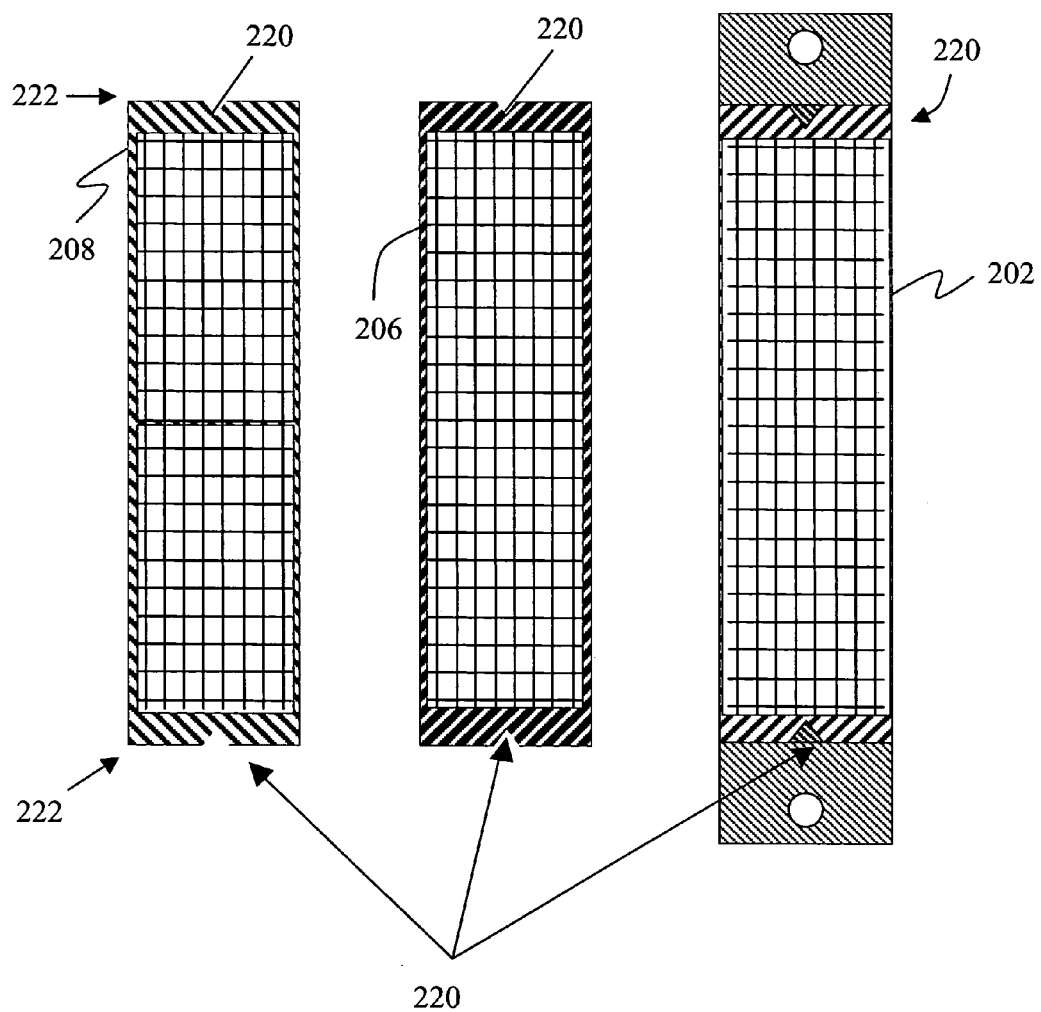
FIG. 6 illustrates a plurality of alignment receptacles or datums.

FIG. 6 illustrates a plurality of alignment receptacles 220, or alignment datums 220 on collimator array 202, scintillator package 206, and diode assembly 208. In an exemplary embodiment, alignment datums 220 are centrally disposed on opposing edges 222 of collimator array 202, scintillator package 206, and diode assembly 208. In an alternative embodiment, alignment datums 220 are not centrally disposed (i.e., disposed off a central axis of collimator array 202, scintillator package 206, and/or diode assembly 208). Alignment datums 220 provide common mechanical datums to facilitate proper alignment of one collimator array 202, one scintillator package 206, and one diode assembly 208, with or without flexible member 200, to form one module 212, and to easily align a plurality of modules 212.

Figure 7:
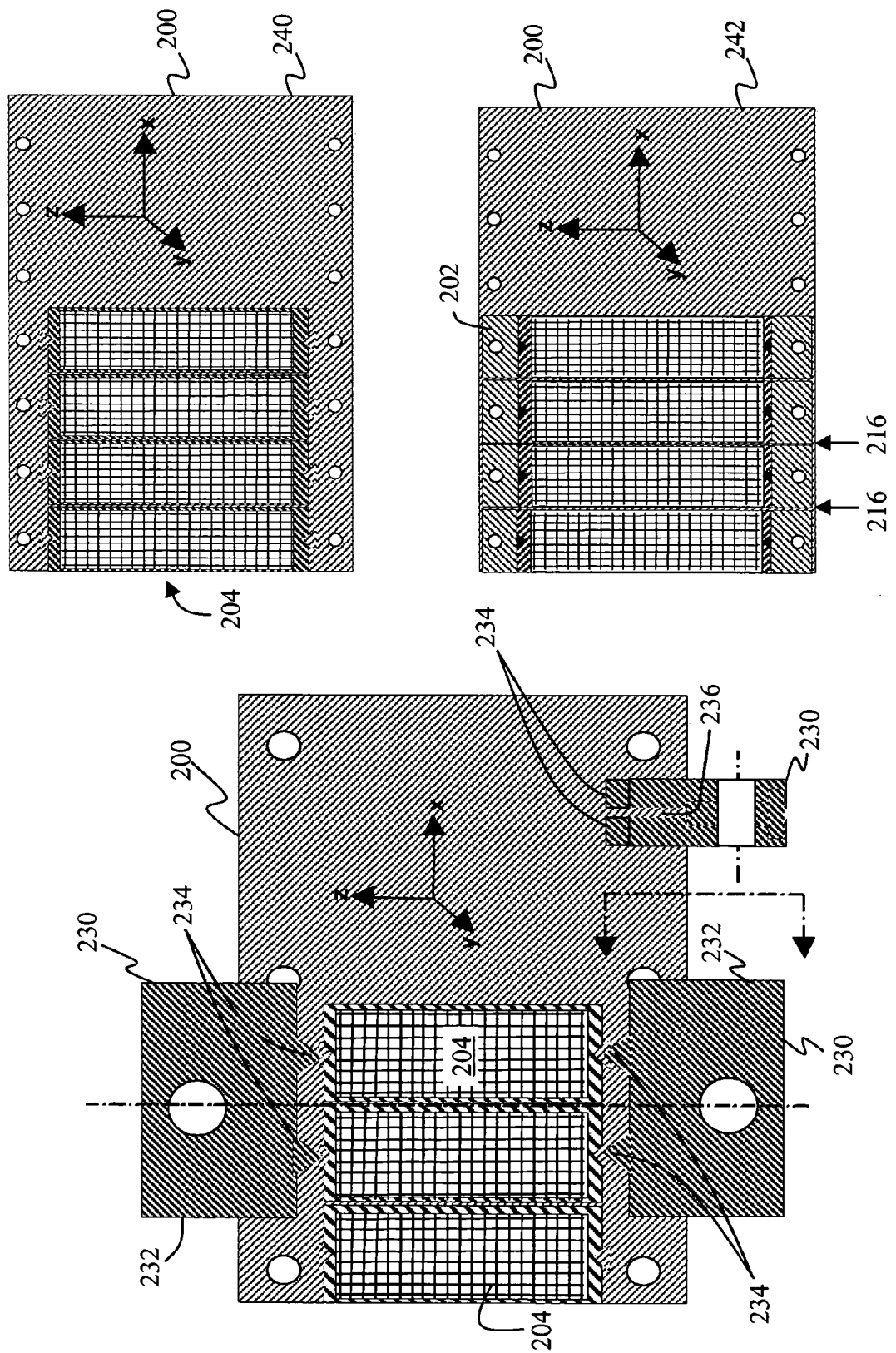
FIG. 7 illustrates an alignment tool including a body having at least two alignment datums extending therefrom.

FIG. 7 illustrates an alignment tool 230 including a body 232 having at least two alignment protrusions 234 or datums 234 extending therefrom. Note, that as used herein, the term datum refers to protrusions, receptacles, and any other structure providing an alignment capability. Alignment tool 230 also includes a longitudinal channel 236 sized to receive flexible member 200, in one embodiment, In other embodiments not utilizing flexible member 200, alignment tool 230 may not include longitudinal channel 236. Channel 236 facilitates easily aligning components (e.g., collimator array 202, scintillator package 206, and/or diode assembly 208) on both sides of flexible member 200. For example, flexible member 200 includes a first side 240 for positioning one or more scintillator arrays 204, and a second side 242 for positioning one or more collimator arrays 202. Additionally, collimator array 204, scintillator package 206, and diode assembly 208 can be aligned on flexible member 200 utilizing conventional optical alignment technology such as a vision system with pick and place to directly align pixels of collimator array 204, scintillator package 206, and diode assembly 208.

In embodiments without flexible member 200, alignment tool 230 is used to align collimator array 202, scintillator package 206, and diode assembly 208 to form module 212. Note that scintillator package 206 and diode assembly 208 may be optically aligned with alignment tool 230 and coupled together with coupler 211 to form scintillator array 204, and then scintillator array 204 is aligned with collimator array 202 also with alignment tool 230 to form module 212. Alternatively, alignment tool 230 is used to align collimator array 202, scintillator package 206, and diode assembly 208 to form module 212 in one step.

In embodiments with flexible member 200, alignment tool 230 is used to align collimator array 202, scintillator package 206, and diode assembly 208 to form module 212. Note that scintillator package 206 and diode assembly 208 may be optically aligned with alignment tool 230 and coupled together with coupler 211 to form scintillator array 204, and then scintillator array 204 is aligned with collimator array 202 also with alignment tool 230 to form module 212. Alternatively, alignment tool 230 is used to align collimator array 202, scintillator package 206, and diode assembly 208 to form module 212 in one step. Alignment tool 230 also provides for spacing of modules 212 on flexible member 200. For example, alignment datums 234 are spaced D distance apart (center to center), and accordingly, modules 212 are spaced D distance apart (datum center to datum center). Note, the spacing of alignment datums 234 affects the size of spaces 216 and the spacing of alignment datums 234 is selectable upon a desired radius of curvature.

After a first module 212 is positioned and adhesively attached to flexible member 200, alignment tool 230 facilitates the positioning of additional modules 212 to create detector arrays 18 of different sizes. For example, one detector array 18 includes M detector modules 212, and another detector array 18 includes N detector modules where N is not equal to M, and, therefore, the detector arrays are of different sizes. Alignment tool 230 also facilitates the easy replacement of a module in a detector array 18 if a module is in need of replacement. For example, given any modular detector assembly including at least one existing module including an alignment datum, to replace a module, one removes a module to be replaced from the assembly, provides a replacement module including at least one alignment datum, and uses alignment tool 230 to position the replacement module in the assembly with respect to the existing module.

Exemplary embodiments are described above in detail. The assemblies and methods are not limited to the specific embodiments described herein, but rather, components of each assembly and/or method may be utilized independently and separately from other components described herein.

While the invention has been described in terms of various specific embodiments, those skilled in the art will recognize that the invention can be practiced with modification within the spirit and scope of the claims.

What is claimed is:

1. A method for fabricating a detector assembly, said method comprising:
   positioning a first scintillator array on a first surface of a flexible member; and
   positioning a first collimator array on a second surface of the flexible member,
   wherein the first surface and the second surface are opposing surfaces that are substantially parallel and face away from each other.

2. A method in accordance with claim 1 further comprising positioning a second scintillator array on the first surface of the flexible member with an alignment tool comprising a body with at least two alignment datums extending therefrom, wherein each of the first and second scintillator arrays comprises at least one alignment datum.

3. A method in accordance with claim 2 further comprising positioning a second collimator array on the second surface of the flexible member with the alignment tool, wherein each of the first and second collimator arrays comprises at least one alignment datum.

4. A method in accordance with claim 2 wherein the alignment tool is separate from the flexible member.

5. A method in accordance with claim 1 further comprising positioning a second collimator array on the second surface of the flexible member with an alignment tool comprising a body with at least two alignment datums extending thereon, wherein each of the first and second collimator arrays comprises at least one alignment datum.

6. A method in accordance with claim 5 wherein the alignment tool is separate ftom the flexible member.

7. A method in accordance with claim 1 further comprising:
   bending the flexible member into an arc; and
   positioning the bent flexible member to receive radiation from a radiation source.

8. A method in accordance with claim 1 wherein said positioning a first scintillator array comprises positioning the first scintillator array on a first surface of a flexible member comprising graphite.

9. A method in accordance with claim 1 wherein the flexible member is X-ray translucent.

10. A method for fabricating a detector array, said method comprising:
    providing a plurality of diode assemblies each comprising at least one alignment datum;
    providing a plurality of scintillator packages each comprising at least one alignment datum;
    providing a plurality of collimator arrays each comprising at least one alignment datum;
    optically coupling each diode assembly with one respective scintillator package and one respective collimator array by aligning the alignment datums of the respective diode assembly, scintillator package, and collimator array using an alignment tool comprising a body with at least two alignment datums extending thereon, wherein the alignment tool does not form a component of the detector array; and
    positioning a flexible member between one of the scintillator packages and one of the collimator arrays by positioning one of the scintillator packages on a first surface of the flexible member and positioning one of the collimator arrays on a second surface of the flexible member, wherein the first surface and the second surface are opposing surfaces that are substantially parallel and face away from each other.

11. A method in accordance with claim 10 further comprising:
    positioning the diode assemblies on the scintillator package.

12. A method in accordance with claim 10 wherein the alignment tool is separate from the flexible member.

13. A method of replacing a detector module in a modular detector assembly including at least one existing module including an alignment datum, said method comprising:
    removing a module to be replaced from the assembly;
    providing a replacement module comprising at least one alignment datum;
    using an alignment tool comprising a body with at least two alignment datums extending thereon to position the replacement module in the assembly with respect to the existing module, wherein the existing module includes a scintillator array; and placing a flexible member between a collimator array and the scintillator array by positioning the scintillator array on a first surface of the flexible member and positioning the collimator array on a second surface of the flexible member, wherein the first surface and the second surface are opposing surfaces that are substantially parallel and face away from each other.

14. A method in accordance with claim 13 wherein the alignment tool includes a channel configured to facilitate an alignment of the scintillator array, the collimator array, a diode assembly, and the flexible member.

15. A method in accordance with claim 13 wherein the alignment tool is separate from the flexible member.

16. A method for fabricating a plurality of detector assemblies, said method comprising:
   providing a plurality of diode assemblies each comprising at least one alignment datum;
   providing a plurality of scintillator packages each comprising at least one alignment datum;
   providing a plurality of collimator arrays each comprising at least one alignment datum;
   optically coupling each diode assembly with one respective scintiliator package and one respective collimator array by aligning the alignment datums of the respective diode assembly, scintillator package, and collimator array to form a plurality of detector modules;
   positioning a flexible member between one of the scintillator packages and one of the collimator arrays by positioning one of the scintillator packages on a first surface of the flexible member and positioning one of the collimator arrays on a second surface of the flexible member, the first surface and the second surface are opposing surfaces that are substantially parallel and face away from each other;
   positioning N detector modules on a first member to form a first detector assembly; and
   positioning M detector modules on a second member to form a second detector assembly, wherein M is not equal to N and the first and second detector assemblies are different sized.

17. A detector assembly comprising:
   a flexible member comprising a first surface and a second surface;
   a first scintillator array positioned on said first surface of said flexible member; and
   a first collimator array positioned on said second surface of said flexible member, said first collimator array optically coupled to said first scintillator array, wherein said first surface and said second surface are opposing surfaces that are substantially parallel and face away from each other.

18. An assembly in accordance with claim 17 further comprising:
   a second scintillator array positioned on said first surface of said flexible member, said first and second scintillators each comprising an alignment datum, said first and second scintillators' alignment datums separated by a distance D; and
   a second collimator array positioned on said second surface of said flexible member, said first and second collimators each comprising an alignment datum; said first and second collimators' alignment datums separated by the distance D.

19. An assembly in accordance with claim 17 wherein said flexible member bent in an arc.

20. An assembly in accordance with claim 17 wherein said flexible member comprises graphite.

21. A detector assembly comprising:
   a flexible member having a first surface and a second surface;
   a diode assembly comprising at least one alignment datum, said diode assembly positioned on said member first surface;
   a scintillator package comprising at least one alignment datum, said scintillator package positioned on said member first surface; and
   a collimator array comprising at least one alignment datum aligned with said diode assembly alignment datum, said collimator array positioned on said member second surface, wherein said diode assembly, said scintillator package, and said collimator array are optically coupled, wherein said member first surface and said member second surface are opposing surfaces that are substantially parallel and face away from each other.

22. An assembly in accordance with claim 21 wherein said diode assembly comprises two alignment datums on opposing ends.

23. An assembly in accordance with claim 22 wherein each said scintillator package and said collimator array comprises two alignment datums on opposing ends of both said scintillator package and said collimator array.

24. An imaging system comprising:
   a radiation source;
   a computer operationally coupled to said radiation source; and
   a radiation detector assembly operationally coupled to said computer, said detector assembly comprising:
   a flexible member having a first surface and a second surface;
   a diode assembly comprising at least one alignment datum, said diode assembly positioned on said member first surface;
   a scintillator package comprising at least one alignment datum, said scintillator package positioned on said member first surface; and
   a collimator array comprising at least one alignment datum aligned with said diode assembly alignment datum, said collimator array positioned on said member second surface, wherein said diode assembly, said scintillator package, and said collimator array are optically coupled, and wherein said member first surface and said member second surface are opposing surfaces that are substantially parallel and face away from each other.

25. An imaging system in accordance with claim 24 wherein said radiation detector is an x-ray detector.

* * * * *

UNITED STATES PATENT AND TRADEMARK OFFICE
CERTIFICATE OF CORRECTION

| | |
|---|---|
| PATENT NO. | : 7,235,790 B2 |
| APPLICATION NO. | : 10/780012 |
| DATED | : June 26, 2007 |
| INVENTOR(S) | : Hoge |

Page 1 of 1

It is certified that error appears in the above-identified patent and that said Letters Patent is hereby corrected as shown below:

Column 8, line 15, delete "separate ftom" and insert therefor --separate from--.
Column 9, line 23, delete "scintiliator" and insert therefor --scintillator--.

Signed and Sealed this

Twenty-fourth Day of June, 2008

JON W. DUDAS
*Director of the United States Patent and Trademark Office*